US007292107B2

United States Patent
Hsiao et al.

(10) Patent No.: US 7,292,107 B2
(45) Date of Patent: Nov. 6, 2007

(54) MODULATION METHOD AND APPARATUS WITH ADJUSTABLE DIVISORS OF THE DIVIDERS IN PHASE-LOCKED LOOP

(75) Inventors: Chao-Chih Hsiao, Taipei (TW); Min-Chieh Hsu, Taipei County (TW); Ping-Hsun Hsieh, Taoyuan County (TW)

(73) Assignee: Novatek Microelectronics Corp., Hsinchu (TW)

( * ) Notice: Subject to any disclaimer, the term of this patent is extended or adjusted under 35 U.S.C. 154(b) by 87 days.

(21) Appl. No.: 11/163,356

(22) Filed: Oct. 17, 2005

(65) Prior Publication Data
US 2006/0261906 A1 Nov. 23, 2006

(30) Foreign Application Priority Data
May 23, 2005 (TW) ................. 94116656 A

(51) Int. Cl.
*H03L 7/00* (2006.01)
*H03C 3/00* (2006.01)

(52) U.S. Cl. .................... 331/23; 331/25; 331/34; 332/100; 332/128; 327/156

(58) Field of Classification Search ................ 331/18, 331/23, 25, 34, 1 A; 332/100, 101, 102, 332/117, 126, 127, 128; 327/156, 157
See application file for complete search history.

(56) References Cited

U.S. PATENT DOCUMENTS

| 3,805,192 | A | * | 4/1974 | Ocnaschek et al. | 332/127 |
| 5,091,706 | A | * | 2/1992 | Lautzenhiser | 332/127 |
| 5,467,373 | A | * | 11/1995 | Ketterling | 375/327 |

\* cited by examiner

*Primary Examiner*—Robert Pascal
*Assistant Examiner*—Ryan J Johnson
(74) *Attorney, Agent, or Firm*—Jianq Chyun IP Office

(57) ABSTRACT

A modulation method and a modulation apparatus in a phase-locked loop (PLL) provided. The modulation apparatus comprises a modulator, a crystal oscillator, a controllable R-divisor frequency divider, a controllable N-divisor frequency divider and a voltage-controlled oscillator (VCO). The crystal oscillator generates a fixed frequency oscillating signal. The controllable R-divisor frequency divider receives the oscillating signal from the crystal oscillator and divides the frequency by R. The VCO generates a frequency signal based on a voltage-controlled signal provided by the PLL and feedbacks the frequency signal to the controllable N-divisor frequency divider. The controller N-divisor frequency divider receives a feedback frequency from the VCO and divides the frequency by N. A PLL unit used to compare a frequency provided by the crystal oscillator and passed through the controllable R-divisor frequency divider, with a frequency provided by the VCO and passed through the controllable N-divisor frequency divider, for performing a phase-locked operation.

11 Claims, 3 Drawing Sheets

MODULATION METHOD AND APPARATUS WITH ADJUSTABLE DIVISORS OF THE DIVIDERS IN PHASE-LOCKED LOOP

CROSS-REFERENCE TO RELATED APPLICATION

This application claims the priority benefit of Taiwan application serial no. 94116656, filed on May 23, 2005. All disclosure of the Taiwan application is incorporated herein by reference.

BACKGROUND OF THE INVENTION

1. Field of the Invention

The present invention relates to a modulation method and apparatus for the phase-locked loop, and more particularly, to a modulation method and apparatus with adjustable divisors of the dividers in the phase-locked loop.

2. Description of the Related Art

The technique of Phase-Locked Loop (PLL) has been developed since long time ago; yet it still plays a significant role because of its wide applications and potential for advancement. Many of its advantages are continuously improved and upgraded, such as increased frequency, improved stability, broadened bandwidth, and short locked-time, etc.

Briefly, the basic principle of the PLL operation is using an oscillating source with an extremely low frequency variance as a reference base to drive the operation of the variable frequency components through a feedback operation of the closed-loop control system, enabling those components to rapidly, continuously and stably operate in the same phase with the oscillating source. The operation mentioned above is well known as the phase-locked operation. When the internal circuit has reached the phase-locked state, the circuit can be used as a modulation/demodulation circuit for the communication system.

Figure 1:
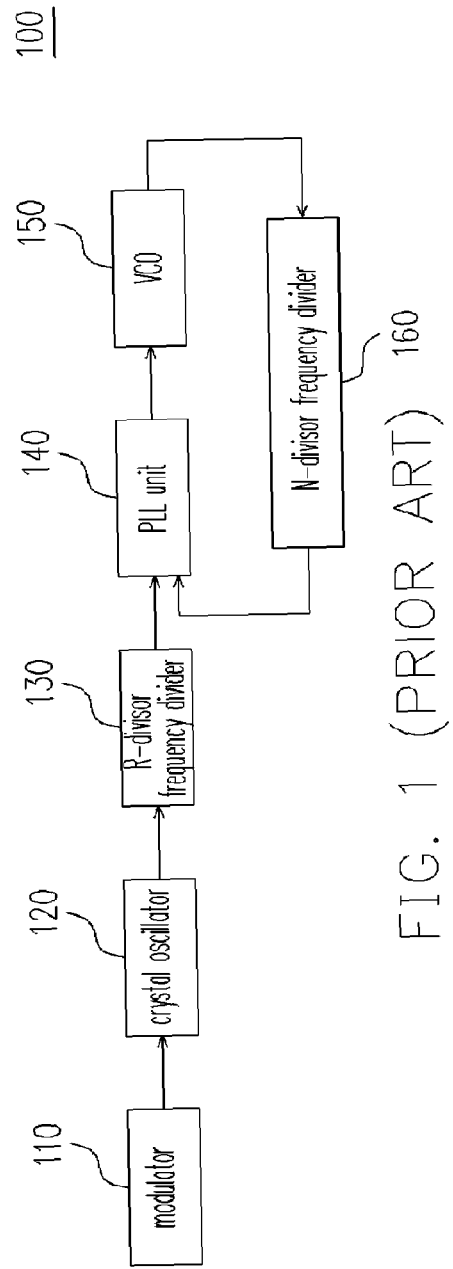

FIG. 1 schematically shows a circuit block diagram of a conventional PLL modulation circuit. The conventional PLL modulation circuit 100 comprises a modulator 110, a crystal oscillator 120, an R frequency divider 130, a PLL unit 140, a voltage controlled oscillator (VCO) 150 and an N frequency divider 160. In the conventional PLL modulation circuit 100 of FIG. 1, the modulator 110 is used to change the frequency of the crystal oscillator 120 so as to modulate RF (Radio Frequency) signals. However, such modulation method inevitably causes an effect similar to amplitude modulation (AM) on the oscillating signals, and then these signals are provided to the PLL unit 140 through the R frequency divider 130. Accordingly, the malfunction of the PLL occurs due to these incorrect signals.

Figure 2:
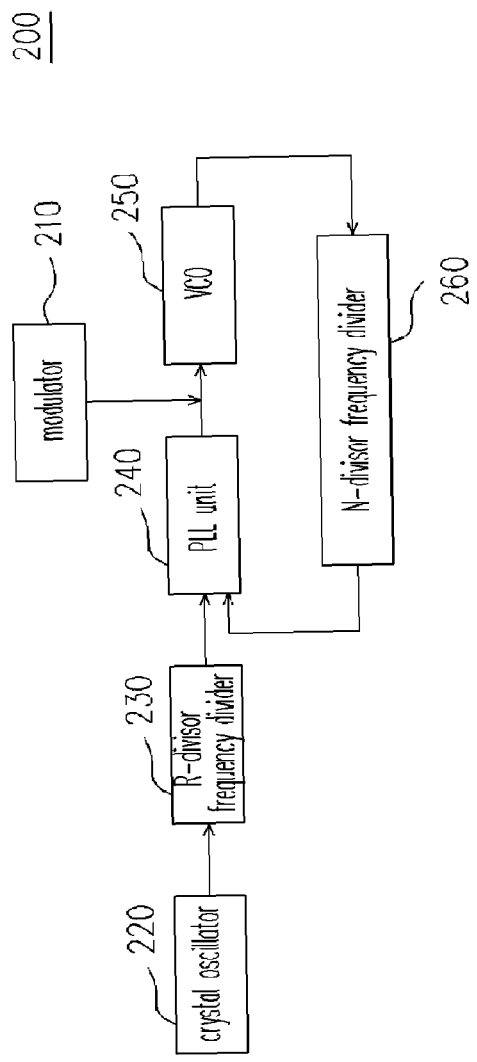

FIG. 2 schematically shows another conventional PLL modulation circuit 200. The conventional PLL modulation circuit 200 comprises a modulator 210, a crystal oscillator 220, an R frequency divider 230, a PLL unit 240, a voltage controlled oscillator (VCO) 250 and an N frequency divider 260. In the PLL modulation circuit 200, a modulation signal required is directly provided to the control voltage terminal of the VCO 250 to execute a modulation effect. With such method, a longer phase-locked time is required to activate the circuit to reach the phase-locked state. In addition, the low pass loop filter inside the PLL is not suitable for the RF with lower data transfer rate.

Accordingly, in order to eliminate the shortcomings and limitations of the conventional PLL modulation circuit mentioned above, the present invention offers a modulation method and apparatus with adjustable divisors of the dividers in PLL, capable of providing a faster, more stable and accurate modulation.

SUMMARY OF THE INVENTION

Therefore, it is an object of the present invention to provide a modulation method and apparatus with adjustable divisors of the dividers in PLL.

In order to achieve object mentioned above, the present invention provides a PLL modulation circuit. The PLL modulation circuit comprises a modulator, a crystal oscillator, a first divisor-controllable frequency divider, a second divisor-controllable frequency divider, a PLL unit and a VCO. The modulator generates a modulation signal. The crystal oscillator receives the modulation signal and generates an oscillating signal with a first frequency. The first divisor-controllable frequency divider electrically coupled to the crystal oscillator divides the first frequency of the oscillating signal by a first divisor of the first divisor-controllable frequency divider. The PLL unit receives the oscillating signal whose frequency has been divided by the first divisor, and the frequency of the oscillating signal divided by the first divisor is used as a phase-locked reference frequency of the PLL unit. Then, the VCO receives an output signal from the PLL unit and generates an oscillating signal with a second frequency. The second divisor-controllable frequency divider receives an oscillating signal with the second frequency, and divides the second frequency of the oscillating signal by a second divisor of the second divisor-controllable frequency divider and an output is further provided to the PLL unit. In addition, the frequency of the oscillating signal divided by the second divisor is used as a feedback frequency of the PLL unit, and a phase-locked operation is accomplished by the PLL unit based on the phase-locked reference frequency and the feedback frequency. Wherein, the first divisor of the first divisor-controllable frequency divider is synchronized with the second divisor of the second divisor-controllable frequency divider based on the data to be modulated.

The PLL modulation circuit mentioned above further comprises a data modulation signal generator. Wherein, the data modulation signal generator electrically coupled to the first divisor-controllable frequency divider, the PLL unit, and the second divisor-controllable frequency divider receives the data to be modulated and controls and adjusts the first divisor of the first divisor-controllable frequency divider and the second divisor of the second divisor-controllable frequency divider based on the data state, so as to control the PLL unit to perform the phase-locked operation.

In the PLL modulation circuit mentioned above, if the state of the data to be modulated is either at logic high or logic low, the data modulation signal generator adjusts the first divisor and the second divisor simultaneously based on the data state.

In order to achieve object mentioned above, the present invention provides a PLL modulation method. The PLL modulation method comprises the following steps. First, an oscillating signal with a first frequency is generated. Then, the first frequency of the oscillating signal is divided by a first divisor and thereby an output is provided to a PLL unit, such that the frequency of the oscillating signal divided by the first divisor is used as a phase-locked reference frequency of the PLL unit. Then, an oscillating signal with a second frequency is generated by the VCO based on the output provided by the PLL unit. Then, the second frequency of the oscillating signal is divided by a second divisor, and an output is provided to the PLL unit. In addition, the frequency of the oscillating signal divided by the second divisor is used as a feedback frequency of the PLL unit, and a phase-locked operation is accomplished by the PLL unit based on the phase-locked reference frequency and the feedback frequency. Wherein, the first divisor of the first divisor-controllable frequency divider is synchronized with the second divisor of the second divisor-controllable frequency divider based on the data to be modulated.

The PLL modulation method mentioned above further comprises controlling and adjusting the first divisor and the second divisor, and controlling the PLL unit to perform the phase-locked operation. Wherein, in an embodiment of the present invention, if the state of the data to be modulated is either at logic high or logic low, the first divisor and the second divisor are adjusted simultaneously based on the data state.

BRIEF DESCRIPTION DRAWINGS

The accompanying drawings are included to provide a further understanding of the invention, and are incorporated in and constitute a part of this specification. The drawings illustrate embodiments of the invention, and together with the description, serve to explain the principles of the invention.

FIG. 1 and FIG. 2 schematically show the block diagrams of the conventional PLL modulation circuits.

Figure 3:
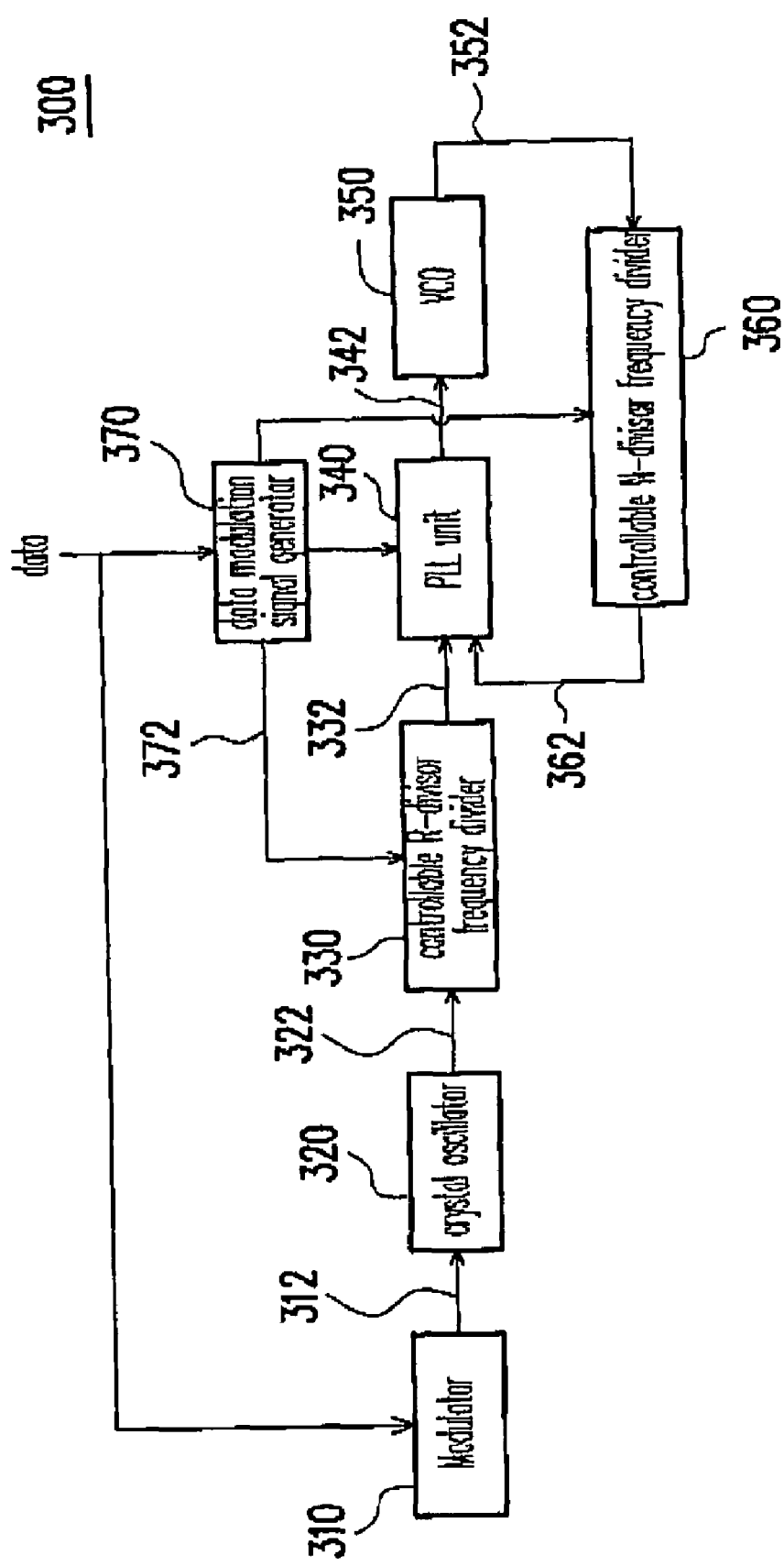

FIG. 3 schematically shows a circuit diagram of a PLL modulation circuit according to a preferred embodiment of the present invention.

Figure 4:
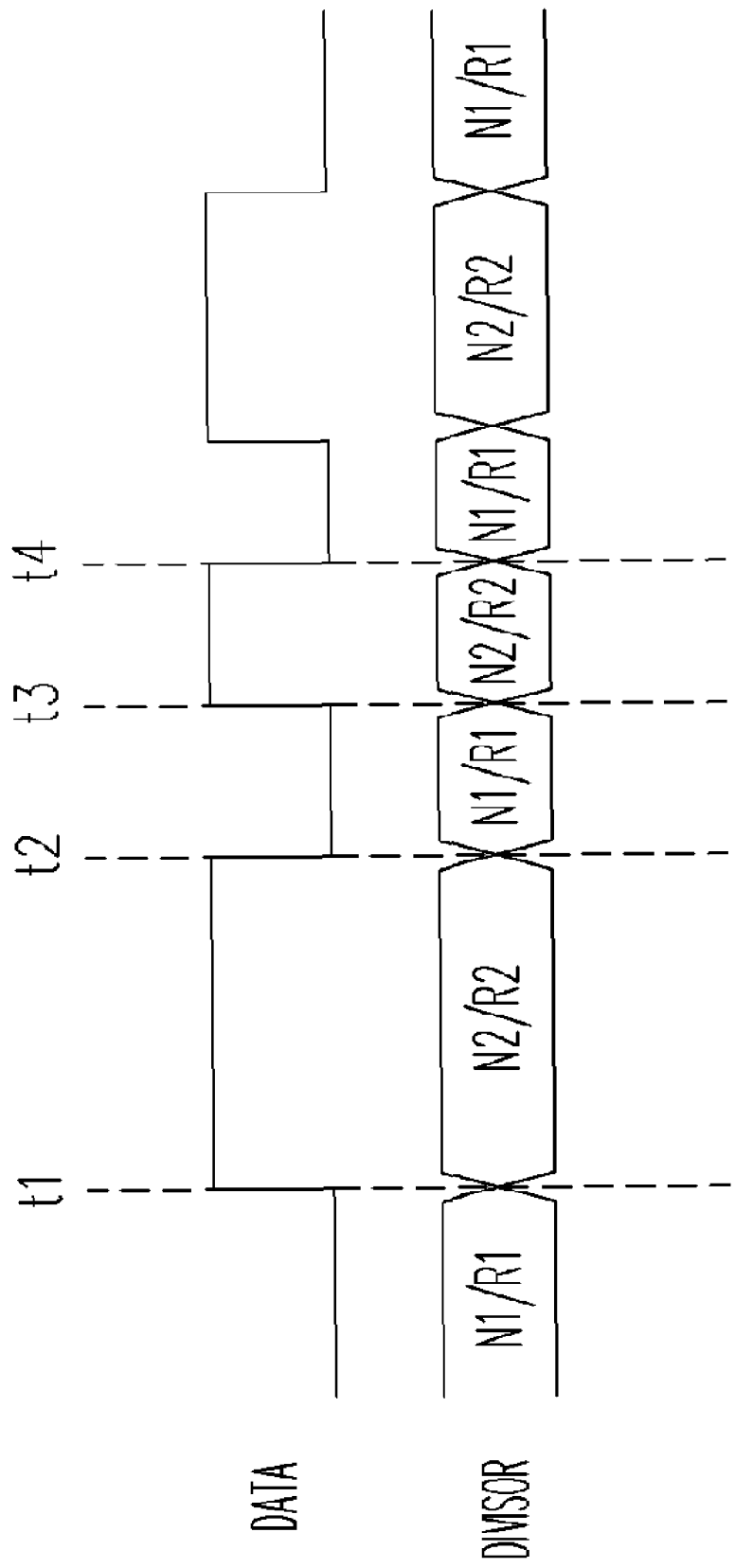

FIG. 4 schematically shows a timing diagram of the frequency modulation of the PLL modulation circuit based on the present invention.

DESCRIPTION PREFERRED EMBODIMENTS

Accordingly, in order to solve the shortcomings of the modulation operation in the conventional PLL, such as incorrect phase-locked operation, long phase-locked time and inapplicable for lower data transfer rate, the present invention provides a modulation method and apparatus with adjustable divisors of the frequency dividers in PLL.

FIG. 3 schematically shows a block diagram of a PLL modulation circuit according to a preferred embodiment of the present invention. The PLL modulation circuit 300 comprises a modulator 310, a crystal oscillator 320, a controllable R-divisor frequency divider 330, a PLL unit 340, a VCO 350, a controllable N-divisor frequency divider 360 and a data modulation signal generator 370. In the embodiment of the present invention, the PLL unit 340 may be composed of a phase/frequency detector (PFD), a charge pump and a loop filter. Also, the circuits implemented by other techniques capable of locking the phase of signals can also be employed in the present embodiment.

In the PLL modulation circuit 300 of the present invention, the modulator 310 receives the data to be modulated, and the crystal oscillator 320 receives the modulation signal 312 from the modulator 310 and generates an oscillating signal 322. The controllable R-divisor frequency divider 330 divides the frequency or the oscillating signal 322 wherein the divisor R may be controlled externally. Then, a frequency-dividing signal 332 with a frequency Fref/R generated by the controllable R-divisor frequency divider 330 is outputted to the PLL unit 340 and it's served as a phase-locked reference frequency of the PLL unit 340. Then, output or the PLL 340 is used for controlling the VCO 350 to generate an oscillating signal 352 with an oscillating frequency F.

Afterwards, the oscillating signal 352 is provided to the controllable N-divisor frequency divider 360, and a signal with frequency F/N is obtained after the frequency-dividing operation by the controllable N-divisor frequency divider 360 is performed. This signal with frequency F/N is outputted to the PLL unit 340 and served as a feedback frequency of the PLL unit 340. Therefore, the phase-locked operation is accomplished by the PLL unit based on the phase-locked reference frequency Fref/R and the feedback frequency F/N mentioned above, and the reference frequency Fref/R tends to be equal to the feedback frequency F/N.

In other words, when it is required to generate a signal of frequency shift keying (FSK) coding with fixed frequency shift, in the PLL modulation circuit 300 of the present embodiment, different divisors values N and R of the N-divisor and R-divisor frequency dividers are controlled such that the signal desired is generated, obeying the formula below. $F1=(Fref/N1)\times R1$, $F2=(Fref/N2)\times R2$, where F1, F2 indicate two frequencies "0" and "1" of the signals in the FSK modulation, and Fref indicates the reference frequency generated by the crystal oscillator 320.

As described previously, when it is desired to generate a frequency of data representing "0", the divisors of the controllable N-divisor frequency divider 360 and the controllable R-divisor frequency divider 330 in FIG. 3 are changed to N1 and R1, respectively. Similarly, when it is desired to generate a frequency of data representing "1", the divisors of the controllable N-divisor frequency divider 360 and the controllable R-divisor frequency divider 330 in FIG. 3 are changed to N2 and R2, respectively. FIG. 4 schematically shows a timing diagram of the frequency modulation of the PLL modulation circuit based on the present invention, and the relationship of the practical waveforms between the data modulation (DATA) and the divisors (DIVISOR) is shown. Wherein, two different sets of divisors are used, as shown in FIG. 4. When the data modulation signal is "0", e.g. between the time points t2 and t3, a first set of divisors N1/R1 is selected. Alternatively, when the data modulation signal is "1", e.g. between the time points t1 and t2 or t3 and t4, a second set of divisors N2/R2 is selected. Therefore, the modulation is operated by switching between these two different sets of divisors based on the given data modulation signal. Moreover, it can be seen in the diagram, the switching of the divisors occur on the corresponding rising edge and falling edge of the modulation data waveform. Accordingly, in the present invention, since the controllable R-divisor frequency divider 330, the PLL unit 340 and controllable N-divisor frequency divider 360 are connected and the operation is synchronized, the frequency of signals can be rapidly modulated to meet the design requirements predetermined by the user, such that the phase-locked speed is effectively improved, and the problem of sudden errors in phase-locking is avoided.

It's worthy to note, in order to achieve the technique mentioned above, as shown in FIG. 3, the PLL modulation circuit 300 of the present embodiment further comprises a data modulation signal generator 370. The data modulation signal generator 370 receives the data to be modulated and simultaneously outputs a control signal 372 to the controllable R-divisor frequency divider 330, the PLL unit 340 and the controllable N-divisor frequency divider 360 based on the state of the received data, e.g. the logic level of the received data. For instance, when the data modulation signal is at logic level state of "0" or "1", the modulation is accomplished by switching the divisors for the data modulation signal. In addition, the data state mentioned above is not necessarily limited to be at "0" or "1" logic level and it may be different based on the design requirements.

In summary, in the modulation method with adjustable divisors of the dividers in the phase-locked loop provided by the present invention, since the divisor-controllable frequency dividers are used and a data modulation signal is further added, the shortcomings such as phase-locked malfunction, too long phase-locked time, inapplicability for lower data transfer rate for the modulator in conventional modulation are effectively prevented. Accordingly, the present invention provides a better, faster, more effective and stable RF modulation.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A phase-locked loop (PLL) modulation circuit, comprising:
    a modulator for generating a modulation signal;
    a crystal oscillator for receiving the modulation signal and generating an oscillating signal with a first frequency;
    a first divisor-controllable frequency divider electrically coupled to the crystal oscillator for dividing the first frequency of the oscillating signal by a first divisor of the first divisor-controllable frequency divider;
    a PLL unit for receiving the oscillating signal whose frequency has been divided by the first divisor, and the frequency of the oscillating signal divided by the first divisor is sewed as a phase-locked reference frequency;
    a voltage-controlled oscillator (VCO) for receiving an output from the PLL unit and generating an oscillating signal with a second frequency; and
    a second divisor-controllable frequency divider for receiving the oscillating signal with the second frequency, and dividing the second frequency of the oscillating signal by a second divisor of the second divisor-controllable frequency divider and providing an output to the PLL unit, wherein the frequency of the oscillating signal divided by the second divisor is served as a feedback frequency of the PLL unit, and the PLL unit performs a phase-locked operation basing on the phase-locked reference frequency and the feedback frequency, wherein
    the first divisor of the first divisor-controllable frequency divider is synchronized with the second divisor of the second divisor-controllable frequency divider based on data to be modulated.

2. The PLL modulation circuit of claim 1, further comprising a data modulation signal generator electrically coupled to the first divisor-controllable frequency divider, the PLL unit and the second divisor-controllable frequency divider for receiving the data to be modulated, controlling and adjusting the first divisor of the first divisor-controllable frequency divider and the second divisor of the second divisor-controllable frequency divider based on a data state, and controlling the PLL unit to perform the phase-locked operation.

3. The PLL modulation circuit of claim 1, wherein the data modulation signal generator adjusts the first divisor and the second divisor simultaneously based on the data state.

4. A phase-locked loop (PLL) modulation method, comprising:
    generating an oscillating signal with a first frequency;
    dividing the first frequency of the oscillating signal by a first divisor and thereby providing an output to a PLL unit, and using the frequency of the oscillating signal divided by the first divisor as a phase-locked reference frequency of the PLL unit;
    generating an oscillating signal with a second frequency by a voltage-controlled oscillator (VCO) based an an output of the PLL unit; and
    dividing the second frequency of the oscillating signal by a second divisor and thereby providing an output to the PLL unit, using the frequency of the oscillating signal divided by the second divisor as a feedback frequency of the PLL unit, wherein a phase-locked operation is accomplished by the PLL unit based on the phase-lacked reference frequency and the feedback frequency, and the first divisor of the first divisor-controllable frequency divider is synchronized with the second divisor of the second divisor-controllable frequency divider based on the data to he modulated.

5. The PLL modulating method of claim 4, further comprising controlling and adjusting the first divisor and the second divisor based on a data state, and controlling the PLL unit to perform the phase-locked operation.

6. The PLL modulating method of claim 4, wherein the first divisor and the second divisor are simultaneously adjusted based on the data state.

7. A phase-locked loop (PLL) modulation circuit, comprising:
    a modulator for generating a modulation signal;
    a crystal oscillator for receiving the modulation signal and generating an oscillating signal with a first frequency;
    a first divisor-controllable frequency divider electrically coupled to the crystal oscillator for dividing the first frequency of the oscillating signal by a first divisor of the first divisor-controllable frequency divider;
    a PLL unit for receiving the oscillating signal whose frequency has been divided by the first divisor, and the frequency of the oscillating signal divided by the first divisor is served as a phase-locked reference frequency;
    a voltage-controlled oscillator (VCO) for receiving an output from the PLL unit and generating an oscillating signal with a second frequency;
    a second divisor-controllable frequency divider for receiving the oscillating signal with the second frequency, and dividing the second frequency of the oscillating signal by a second divisor of the second divisor-controllable frequency divider and providing an output to the PLL unit, wherein the frequency of the oscillating signal divided by the second divisor is served as a feedback frequency of the PLL unit, and the PLL unit performs a phase-locked operation basing on the phase-locked reference frequency and the feedback frequency; and
    a data modulation signal generator electrically coupled to the first divisor-controllable frequency divider, the PLL unit and the second divisor-controllable frequency divider for receiving data to be modulated, controlling and adjusting the first divisor of the first divisor-controllable frequency divider and the second divisor of the second divisor-controllable frequency divider based on a data state, and controlling the PLL unit to perform the phase-locked operation, wherein the first divisor of the first divisor-controllable frequency divider is synchronized with the second divisor of the second divisor-controllable frequency divider based on the data to be modulated.

8. The PLL modulation circuit of claim 7, wherein the data modulation signal generator adjusts the first divisor and the second divisor simultaneously based on a data state.

9. The PLL modulation circuit of claim 8, wherein the data to be modulated is digital data, and the data state is logic level state of "0" or "1".

10. A phase-locked loop (PLL) modulation method, comprising:
   generating an oscillating signal with a first frequency;
   dividing the first frequency of the oscillating signal by a first divisor and thereby providing an output to a PLL unit, and using the frequency of the oscillating signal divided by the first divisor as a phase-locked reference frequency of the PLL unit;
   generating an oscillating signal with a second frequency by a voltage-controlled oscillator (VCO) based on an output of the PLL unit; and
   dividing the second frequency of the oscillating signal by a second divisor and thereby providing an output to the PLL unit, using the frequency of the oscillating signal divided by the second divisor as a feedback frequency of the PLL unit,
   wherein a phase-locked operation is accomplished by the PLL unit based on the phase-locked reference frequency and the feedback frequency, and the first divisor of the first divisor-controllable frequency divider is synchronized with the second divisor of the second divisor-controllable frequency divider based on the data to be modulated, the first divisor and the second divisor are simultaneously adjusted based on a data state.

11. The phase-locked loop (PLL) modulation method of claim 10, wherein the data to be modulated is digital data, and the data state is logic level state of "0" or "1".

* * * * *